United States Patent
Ibe et al.

(10) Patent No.: US 8,900,675 B2
(45) Date of Patent: Dec. 2, 2014

(54) DEPOSITION METHOD AND METHOD FOR MANUFACTURING DEPOSITION SUBSTRATE

(75) Inventors: Takahiro Ibe, Kanagawa-ken (JP); Tomoya Aoyama, Kanagawa-ken (JP); Rena Tsuruoka, Hyogo (JP); Satoshi Inoue, Osaka (JP); Tohru Sonoda, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 9 days.

(21) Appl. No.: 13/635,227

(22) PCT Filed: Feb. 28, 2011

(86) PCT No.: PCT/JP2011/054530
§ 371 (c)(1),
(2), (4) Date: Sep. 14, 2012

(87) PCT Pub. No.: WO2011/114872
PCT Pub. Date: Sep. 22, 2011

(65) Prior Publication Data
US 2013/0005121 A1    Jan. 3, 2013

(30) Foreign Application Priority Data
Mar. 18, 2010  (JP) ................................. 2010-062709

(51) Int. Cl.
*B05D 3/06* (2006.01)
*H01L 51/56* (2006.01)
(Continued)

(52) U.S. Cl.
CPC ................ *H05B 33/10* (2013.01); *H01L 51/56* (2013.01); *C23C 14/12* (2013.01); *C23C 14/28* (2013.01); *H01L 51/0027* (2013.01); *C23C 14/564* (2013.01); *H01L 51/5012* (2013.01)
USPC .......................................... 427/557; 427/561

(58) Field of Classification Search
USPC .................................................. 427/557, 561
See application file for complete search history.

(56) References Cited

U.S. PATENT DOCUMENTS

| | | |
|---|---|---|
| 5,904,961 A | 5/1999 | Tang et al. |
| 6,610,455 B1 | 8/2003 | Burberry et al. |

(Continued)

FOREIGN PATENT DOCUMENTS

| | | |
|---|---|---|
| CN | 1369573 A | 9/2002 |
| CN | 1436025 A | 8/2003 |

(Continued)

OTHER PUBLICATIONS

Ronova et al, Influence of chemical structure on glass transition temperature of polyimides, 2010, Struct Chem, 21, p. 1013-1020.*

(Continued)

*Primary Examiner* — Dah-Wei D Yuan
*Assistant Examiner* — Nga Leung V Law
(74) *Attorney, Agent, or Firm* — Husch Blackwell LLP

(57) ABSTRACT

One embodiment of the present invention is a deposition method for forming a layer 13a containing a deposition material on a deposition target surface of a second substrate, comprising the steps of forming an absorbing layer 12 over one surface of a first substrate 11; forming a material layer 13 containing the deposition material over the absorbing layer; performing first heat treatment on the material layer from the other surface of the first substrate to a temperature lower than the sublimation temperature of the deposition material so as to remove an impurity 14 in the material layer 13; disposing the one surface of the first substrate and the deposition target surface of the second substrate to face each other; and performing second heat treatment on the material layer from the other surface of the first substrate.

16 Claims, 4 Drawing Sheets

(51) Int. Cl.

| | | |
|---|---|---|
| *C23C 14/12* | (2006.01) | |
| *C23C 14/28* | (2006.01) | |
| *H05B 33/10* | (2006.01) | |
| *H01L 51/00* | (2006.01) | |
| *C23C 14/56* | (2006.01) | |
| *H01L 51/50* | (2006.01) | |

(56) References Cited

U.S. PATENT DOCUMENTS

| | | | |
|---|---|---|---|
| 7,691,783 | B2 | 4/2010 | Matsuda et al. |
| 7,767,489 | B2 | 8/2010 | Kwon et al. |
| 8,119,204 | B2 | 2/2012 | Ikeda et al. |
| 2002/0139303 | A1 | 10/2002 | Yamazaki et al. |
| 2004/0001972 | A1 | 1/2004 | Chin et al. |
| 2005/0095459 | A1 | 5/2005 | Chin et al. |
| 2005/0142380 | A1 | 6/2005 | Chin et al. |
| 2006/0061267 | A1 | 3/2006 | Yamasaki et al. |
| 2006/0246240 | A1 | 11/2006 | Matsuda et al. |
| 2007/0082288 | A1 | 4/2007 | Wright et al. |
| 2007/0257276 | A1 | 11/2007 | Kwon et al. |
| 2007/0290611 | A1 | 12/2007 | Yamasaki et al. |
| 2008/0233827 | A1* | 9/2008 | Kagami et al. .................. 445/24 |
| 2008/0241733 | A1 | 10/2008 | Wright et al. |
| 2008/0268135 | A1 | 10/2008 | Yokoyama et al. |
| 2008/0268137 | A1* | 10/2008 | Ikeda et al. ...................... 427/70 |
| 2009/0058285 | A1 | 3/2009 | Yamazaki et al. |
| 2009/0104403 | A1 | 4/2009 | Aoyama et al. |
| 2009/0169809 | A1* | 7/2009 | Yokoyama et al. ............ 428/138 |
| 2009/0233006 | A1* | 9/2009 | Yamazaki et al. ............. 427/554 |
| 2012/0148730 | A1 | 6/2012 | Ikeda et al. |

FOREIGN PATENT DOCUMENTS

| | | |
|---|---|---|
| CN | 1469692 A | 1/2004 |
| CN | 101040396 A | 9/2007 |
| CN | 101068042 A | 11/2007 |
| CN | 101272643 A | 9/2008 |
| CN | 101283627 A | 10/2008 |
| CN | 101397649 A | 4/2009 |
| EP | 1 335 637 A1 | 8/2003 |
| EP | 1 852 921 A2 | 11/2007 |
| JP | 10-245547 | 9/1998 |
| JP | 2002-302757 | 10/2002 |
| JP | 2003-229259 | 8/2003 |
| JP | 2004-39630 | 2/2004 |
| JP | 2006-86069 | 3/2006 |
| JP | 2006-309995 | 11/2006 |
| JP | 2007-299736 | 11/2007 |
| JP | 2008-235010 | 10/2008 |
| JP | 2008-288017 | 11/2008 |
| JP | 2008-291352 | 12/2008 |
| JP | 2009-69849 | 4/2009 |
| JP | 2010-7101 | 1/2010 |
| KR | 2002-0064215 | 8/2002 |
| KR | 10-2004-0001381 | 1/2004 |
| KR | 10-2007-0029768 | 3/2007 |
| KR | 10-2007-0072521 | 4/2007 |
| KR | 10-0731755 B1 | 6/2007 |
| KR | 10-2008-0063294 | 7/2008 |
| KR | 10-2008-0085705 | 9/2008 |
| KR | 10-2008-0096381 | 10/2008 |
| KR | 10-2010-00020078 | 1/2010 |
| WO | WO 2006/036297 A2 | 4/2006 |
| WO | WO 2007/044518 A1 | 4/2007 |

OTHER PUBLICATIONS

International Search Report re application No. PCT/JP2011/054530, dated Mar. 29, 2011.

* cited by examiner

DEPOSITION METHOD AND METHOD FOR MANUFACTURING DEPOSITION SUBSTRATE

TECHNICAL FIELD

The present invention relates to a deposition method and a method for manufacturing a deposition substrate.

Background Art

In recent years, research has been extensively conducted on light-emitting elements using electroluminescence (hereinafter also referred to as EL). In a basic structure of such a light-emitting element, a light-emitting layer including a light-emitting substance is interposed between a pair of electrodes. By applying a voltage to this element, light emission can be obtained from the light-emitting substance.

As a deposition method of a light-emitting layer without a metal mask, a method is given in which an organic EL material layer formed over a deposition substrate (a donor substrate) is deposited on a deposition target substrate through thermal transfer (for example, see Patent Document 1).

Further, as another deposition method of a light-emitting layer, a method is given in which an organic EL material layer is formed over a deposition substrate by a wet method using a polymer in which a deposition material is dispersed and the organic EL material layer is deposited on a deposition target substrate through thermal transfer (for example, see Patent Document 2).

REFERENCE

Patent Documents

[Patent Document 1] Japanese Published Patent Application No. 2006-309995
[Patent Document 2] Japanese Published Patent Application No. 2008-291352

SUMMARY OF THE INVENTION

Problems to be Solved by the Invention

In the case where impurities such as moisture or residual solvents are included in an organic EL material layer formed over a deposition substrate, the impurities are mixed also into a light-emitting layer which is deposited on a deposition target substrate through thermal transfer. In the case of the another deposition method of a light-emitting layer using a polymer as a binder, a wet method is used; therefore, there is a high possibility that the impurities may be mixed into the light-emitting layer compared to the case where a vacuum evaporation method is employed.

An object of one embodiment of the present invention is to provide a deposition method in which impurities mixed into a layer formed on a deposition target substrate can be reduced or a method for manufacturing a deposition substrate used for the deposition method.

Means for Solving the Problems

One embodiment of the present invention is a deposition method including the steps of forming an absorbing layer over one surface of a first substrate; forming a material layer containing a deposition material over the absorbing layer; performing first heat treatment on the material layer from the other surface of the first substrate at a temperature lower than the sublimation temperature of the deposition material so as to remove impurities in the material layer; disposing the one surface of the first substrate and a deposition target surface of a second substrate to face each other; and performing second heat treatment on the material layer from the other surface of the first substrate so as to form a layer containing the deposition material on the deposition target surface of the second substrate.

According to the above embodiment of the present invention, before deposition is performed by transferring the material layer formed over the first substrate to the second substrate, the material layer formed over the first substrate is heated to a temperature lower than the sublimation temperature of the deposition material as pretreatment. This allows impurities having low sublimation temperatures to be removed from the material layer while the deposition material is held in the material layer, so that the layer containing the deposition material in which the amount of impurities is reduced can be formed on the deposition target surface of the second substrate.

One embodiment of the present invention is a deposition method including the steps of forming an absorbing layer over one surface of a first substrate; forming a material layer containing a first deposition material, a second deposition material, and a high molecular compound satisfying the formula (1) below over the absorbing layer; performing first heat treatment on the material layer from the other surface of the first substrate at a temperature lower than the glass transition temperature of the high molecular compound so as to remove impurities in the material layer; disposing the one surface of the first substrate and a deposition target surface of a second substrate to face each other; and performing second heat treatment on the material layer from the other surface of the first substrate so as to form a layer containing the first deposition material and the second deposition material on the deposition target surface of the second substrate.

$$Ta-100 \leq S \leq 400 \qquad (1)$$

Note that in the formula (1), S indicates the glass transition temperature (° C.) of the high molecular compound, and Ta indicates the higher (° C.) of the sublimation temperature of the first deposition material and that of the second deposition material.

According to the above embodiment of the present invention, before deposition is performed by transferring the material layer formed over the first substrate to the second substrate, the first heat treatment is performed in which the material layer formed over the first substrate is heated to a temperature lower than the glass transition temperature of the high molecular compound as pretreatment. This allows impurities having low sublimation temperatures to be removed from the material layer while the first deposition material and the second deposition material are held in the material layer, so that the layer containing the first deposition material and the second deposition material in which the amount of impurities is reduced can be formed on the deposition target surface of the second substrate.

Further, according the deposition method of one embodiment of the present invention, the first heat treatment and the second heat treatment are each preferably performed using a method of applying heat by light irradiation from the other surface of the first substrate using a light source and by absorption of the light in the absorbing layer.

One embodiment of the present invention is a method for manufacturing a deposition substrate including the steps of forming an absorbing layer over one surface of a substrate;

forming a material layer containing a deposition material over the absorbing layer; and performing heat treatment on the material layer from the other surface of the substrate at a temperature lower than the sublimation temperature of the deposition material so as to remove impurities in the material layer.

One embodiment of the present invention is a method for manufacturing a deposition substrate including the steps forming an absorbing layer over one surface of a substrate; forming a material layer containing a first deposition material, a second deposition material, and a high molecular compound satisfying the formula (1) below over the absorbing layer; and performing heat treatment on the material layer from the other surface of the substrate to a temperature lower than the glass transition temperature of the high molecular compound so as to remove impurities in the material layer.

$$Ta-100 \leq S \leq 400 \tag{1}$$

Note that in the formula (1), S indicates the glass transition temperature (° C.) of the high molecular compound, and Ta indicates the higher (° C.) of the sublimation temperature of the first deposition material and that of the second deposition material.

Further, in the method for manufacturing a deposition substrate according to one embodiment of the present invention, the heat treatment is preferably performed using a method of applying heat by light irradiation from the other surface of the substrate using a light source and by absorption of the light in the absorbing layer.

Effect of the Invention

By application of one embodiment of the present invention, a deposition method in which impurities mixed into a layer formed on a deposition target substrate can be reduced and a method for manufacturing a deposition substrate used for the deposition method can be provided.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

(Embodiment 1)

In this embodiment, a deposition method of one embodiment of the present invention is described. In this embodiment, a case where an EL layer of a light-emitting element is formed using the deposition method of one embodiment of the present invention is described. Further, in this embodiment, a case where heat treatment is performed using a light source is described. FIGS. 1A to 1D are cross-sectional views illustrating the deposition method of one embodiment of the present invention.

Figure 1A:
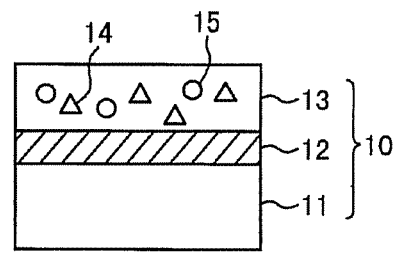
FIGS. 1A to 1D are cross-sectional views illustrating a deposition method according to one embodiment of the present invention.
Figure 1B:
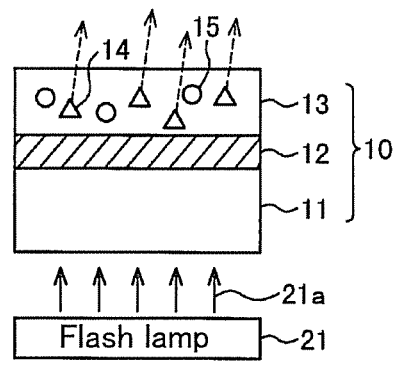
Figure 1C:
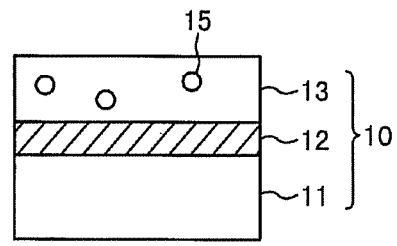

First, a method for manufacturing a deposition substrate (a donor substrate 10) shown in FIGS. 1A to 1C is described.

As shown in FIG. 1A, an absorbing layer 12 is formed over one surface of a first substrate 11 that is a supporting substrate, and an organic EL material layer (hereinafter referred to as a material layer) 13 at least containing an organic material 15 as a deposition material is formed over the absorbing layer 12. In FIG. 1A, the material layer 13 includes impurities 14 such as moisture or residual solvents.

The first substrate 11 is a substrate that transmits irradiation light used for depositing the material layer on a deposition target substrate. Accordingly, the first substrate 11 is preferably a substrate having high light transmittance. Specifically, when lamp light or laser light is used in order to deposit the material layer, a substrate that transmits the light is preferably used as the first substrate 11. As the first substrate 11, a glass substrate, a quartz substrate, a plastic substrate containing an inorganic material, or the like can be used, for example.

The absorbing layer 12 is a layer that absorbs irradiation light for heating the material layer 13 and converts the irradiation light into heat. Therefore, the absorbing layer 12 is formed at least in a region where the material layer 13 is heated and may have an island shape, for example. It is preferable that the absorbing layer 12 be formed of a material having a reflectance of as low as 70% or less with respect to the irradiation light and having high absorptance. In addition, the absorbing layer 12 is preferably formed of a material with high heat resistance so as not to be decomposed by heat. Further, as a material which can be used for the absorbing layer 12, for example, a metal nitride such as titanium nitride, tantalum nitride, molybdenum nitride, tungsten nitride, chromium nitride, and manganese nitride; molybdenum; titanium; tungsten; or carbon is preferably used.

The absorbing layer 12 can be formed by any of various methods. For example, by a sputtering method, the absorbing layer 12 can be formed using a target of molybdenum, tantalum, titanium, tungsten, or the like, or a target using an alloy thereof. In addition, the absorbing layer 12 is not limited to a single layer and may include a plurality of layers.

It is preferable that the absorbing layer 12 have a thickness such that it does not transmit irradiation light. It is preferable that the thickness be 100 nm or more and 2 μm or less although it depends on a material. In particular, with a thickness of 100 nm or more and 600 nm or less, the absorbing layer 12 can efficiently absorb the irradiation light to generate heat.

Note that the absorbing layer 12 may transmit part of the irradiation light as long as the organic material 15 contained in the material layer 13 is heated to a deposition temperature. However, in the case where the absorbing layer 12 transmits part of the irradiation light, a material that does not decompose even when irradiated with light is preferably used for the material layer 13. Note that in this specification, a "deposition temperature" is a temperature at which at least part of a deposition material is transferred from a deposition substrate to a deposition target substrate by the action of heat.

The material layer 13 is transferred to a second substrate by being heated, which is a layer containing the organic material 15 as the deposition material to be deposited on the deposition target substrate. In this embodiment, one kind of the organic material 15 is used as the deposition material contained in the material layer 13; however, two or more kinds of organic materials may be used as the deposition material. The material layer 13 may be a single layer or a stacked layer including a plurality of layers. Note that in this embodiment, "transfer" means that the organic material 15 contained in the material layer 13 is transferred to the deposition target substrate.

The material layer 13 is formed by any of various methods. For example, a wet method such as a spin coating method, a spray coating method, an inkjet method, a dip coating method, a casting method, a die coating method, a roll coating method, a blade coating method, a bar coating method, a gravure coating method, a nozzle printing method, or a printing method can be used. Alternatively, a thy method such as a vacuum evaporation method or a sputtering method can be used.

In order to form the material layer 16 by such a wet method, a desired deposition material may be dissolved or dispersed in a solvent, and a solution or a dispersion solution may be adjusted. There is no particular limitation on the solvent as long as it can dissolve or disperse the deposition material and it does not react with the deposition material. Examples of the solvent are as follows: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. Further, a mixture of plural kinds of those solvents may be used. By using a wet method, it is possible to increase use efficiency of the material and reduce the manufacturing cost.

Note that the thickness of an EL layer 13a formed in a later step (a step shown in FIG. 1D), on the second substrate 22 that is the deposition target substrate depends on the material layer 13 formed over the first substrate 11 that is the supporting substrate. Thus, by controlling the thickness of the material layer 13, the thickness of the EL layer 13a formed on the second substrate 22 that is the deposition target substrate can be controlled easily. Note that the material layer does not necessarily need to be a uniform layer as long as the thickness and uniformity of the EL layer are ensured. For example, the material layer may be formed in a minute island shape or may have unevenness.

Next, as shown in FIG. 1B, light irradiation is performed using a flash lamp 21 as indicated by arrows 21a from the reverse side of the first substrate 11, that is, a surface opposite to the surface where the material layer 13 is formed. The irradiation condition at this time is set such that the organic material 15 contained in the material layer 13 is not sublimated. That is, the energy intensity is set such that the material layer 13 is heated to a temperature lower than the sublimation temperature of the organic material 15. Preferably, the energy intensity is set such that the material layer 13 is heated to 100° C. or more. The irradiation light is transmitted through the first substrate 11 to be absorbed by the absorbing layer 12. The absorbed light is converted to thermal energy, whereby a portion of the material layer 13, which overlaps with the absorbing layer 12, is heated to a temperature lower than the sublimation temperature of the organic material 15 (first heat treatment). Thus, the impurities 14 such as moisture or residual solvents in the material layer 13 are removed. Note that the molecular weight of the impurity 14 is 300 or less. When the heat temperature of the material layer 13 is 100° C. or more, the impurity 14 of which molecular weight is 300 or less is sufficiently removed.

Figure 1D:
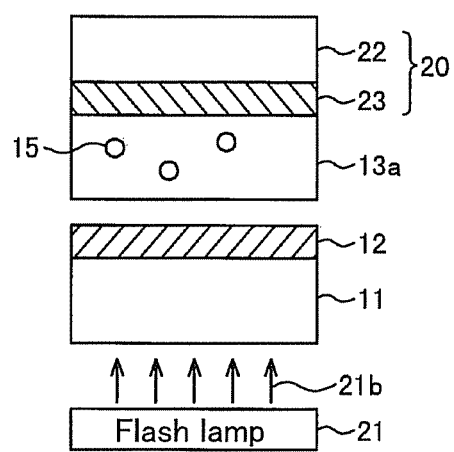

As described above, the deposition substrate (donor substrate) 10 shown in FIG. 1C is manufactured. Next, a deposition method in which the material layer 13 is transferred to a deposition target substrate 20 using the deposition substrate 10 as shown in FIG. 1D is described.

The second substrate 22 that is the deposition target substrate is arranged at a position facing a surface of the first substrate 11, on which the absorbing layer 12 and the material layer 13 are formed. The second substrate 22 is a deposition target substrate on which a desired layer, for example, an electrode layer 23, is deposited through a deposition process. The second substrate 22 is not limited to a substrate as long as it is a substrate having a needed heat resistance property and having an insulating property on its surface. For example, a glass substrate, a quartz substrate, a stainless steel substrate provided with an insulating film, and the like can be given as the second substrate 22. Alternatively, a plastic substrate having a heat resistance property enough to withstand heat treatment may be used.

After that, light irradiation is performed using the flash lamp 21 as indicated by arrows 21b from the reverse side of the first substrate 11, that is, a surface opposite to the surface where the material layer 13 is farmed. The irradiation light is transmitted through the first substrate 11 to be absorbed by the absorbing layer 12. The absorbed light is converted to thermal energy, whereby a portion of the material layer 13, which overlaps with the absorbing layer 12, is heated (second heat treatment). The heated material layer 13 is deposited on the electrode layer 23, whereby the EL layer 13a is formed.

In this embodiment, the flash lamp 21 is used as a light source of the irradiation light in each of the first and second heat treatment; however, a variety of light sources can be used.

For example, a discharge lamp such as a xenon lamp or a metal halide lamp, or an exothermic lamp such as a halogen lamp or a tungsten lamp can be used as the light source. Alternatively, such a light source can be used as a flash lamp (e.g., a xenon flash lamp or a krypton flash lamp). Since a flash lamp is capable of emitting very high-intensity light repeatedly to a large area for a short time (0.1 msec to 10 msec), it can heat the substrate uniformly and efficiently regardless of the area of the first substrate. In addition, the flash lamp can control heating of the first substrate 11 by changing the length of emission time.

Alternatively, a laser oscillation device may be used as the light source. As the laser light, it is possible to use laser light emitted from, for example, a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof. When a solid state laser whose laser medium is solid is used, there are advantages in that maintenance-free condition can be maintained for a long time and output power is relatively stable.

It is to be noted that as the irradiation light, infrared light (a wavelength of 800 nm or more) is preferably used. With infrared light, the absorbing layer 12 can efficiently convert it to heat, and thus the deposition material can be efficiently heated.

It is preferable that the first and the second heat treatment be performed in an atmosphere containing little hydrogen and moisture or in a reduced-pressure atmosphere. The reduced-pressure atmosphere can be obtained by evacuation of the deposition chamber with a vacuum evacuation unit to a vacuum of about $5 \times 10^{-3}$ Pa or less, preferably, about $10^{-4}$ Pa to $10^{-6}$ Pa.

In this embodiment, before the deposition is performed by transferring the material layer 13 formed over the deposition substrate 10 to the deposition target substrate 20, the first heat treatment is performed in which the material layer 13 over the deposition substrate 10 is heated to a temperature lower than the sublimation temperature of the organic material 15 (that is, a temperature at which the material layer 13 is not transferred) as pretreatment. Accordingly, the impurities 14 such as moisture or residual solvents which have lower sublimation temperatures can be removed from the material layer 13 while the organic material 15 is held in the material layer 13, whereby the deposition substrate 10 including the material layer 13 containing few impurities can be obtained (see FIG. 1C). Thus, impurities in the EL layer 13a that is a layer containing the organic material 15 and formed by being transferred to the deposition target substrate 20 can be reduced. Thus, an organic EL element with favorable characteristics and high reliability can be manufactured.

In general, the sublimation temperature means a temperature where a substance is changed from a solid substance into a gas without becoming a liquid; however, in this specification and the like, it includes a temperature where a substance is changed from a liquid into a gas in the case where an impurity is a liquid. That is, in this specification and the like, the sublimation temperature includes the evaporating temperature of a liquid (that is, a boiling point) in some cases.

Note that although the case where the second substrate 22 that is the deposition target substrate is located above the first substrate 11 that is the deposition substrate is illustrated in this embodiment, this embodiment is not limited to this structure. The orientation of the substrates can be set as appropriate.

In the deposition method using the second heat treatment, the thickness of the EL layer 13a to be deposited on the deposition target substrate 20 through the deposition process can be controlled by the thickness of the material layer 13 formed over the first substrate 11. In other words, the material layer 13 included in the deposition substrate 10 may be formed as it is; thus, a film-thickness monitor is not needed. Therefore, a user does not have to adjust the deposition rate with a thickness monitor, and the deposition process can be fully automated. Accordingly, productivity can be increased.

(Embodiment 2)

In this embodiment, a deposition method of one embodiment of the present invention is described. Note that in this embodiment, a case where an EL layer of a light-emitting element is formed by the deposition method of one embodiment of the present invention is described. Note that the deposition method described in this embodiment is performed using a material and a method that are similar to those of Embodiment 1 if not otherwise stated.

Figure 2A:
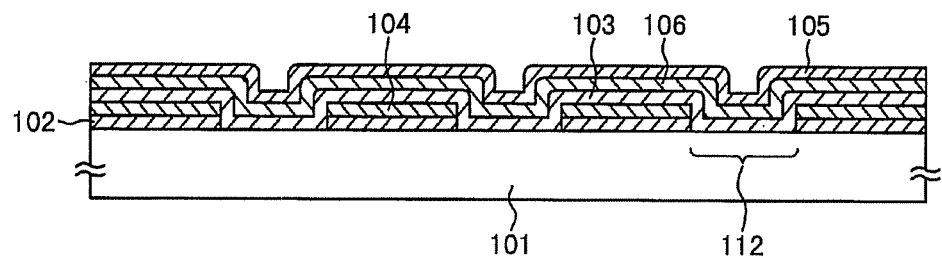
FIGS. 2A to 2C are cross-sectional views illustrating a deposition method according to one embodiment of the present invention.

FIG. 2 shows an example in which a reflective layer, a heat insulating layer, and a protective film are formed over the first substrate. In FIG. 2A, a reflective layer 102 is selectively formed over one surface of a first substrate 101 that is a supporting substrate. Note that the reflective layer 102 includes an opening 112. A heat insulating layer 104 is formed over the reflective layer 102. The heat insulating layer 104 includes the opening 112 at a position overlapping with the opening of the reflective layer 102. Further, an absorbing layer 103 covering the openings is formed over the first substrate 101 over which the reflective layer 102 and the heat insulating layer 104 are formed. Further, a protective layer 106 is Mimed over the absorbing layer 103. Further, a material layer 105 containing an organic material as a deposition material is formed over the protective layer 106. In FIG. 2A, the material layer 105 contains impurities such as moisture or residual solvents.

Note that in this specification, "overlap" means not only the case where components included in a deposition substrate (e.g., a reflective layer and an absorbing layer) overlap with each other while being in direct contact with each other but also the case where the components overlap with each other with another layer provided therebetween.

A method for manufacturing a deposition substrate and a deposition method using the deposition substrate are described below.

First, the reflective layer 102 is selectively formed over the one surface of the first substrate 101. The reflective layer 102 reflects light with which the first substrate 101 is irradiated to block a portion of the material layer 105, which overlaps with the reflective layer 102 so that heat is not transmitted to this portion. Thus, the reflective layer 102 is preferably formed of a material having high reflectance with respect to the irradiation light. Specifically, the reflective layer 102 is preferably formed using a material having a reflectance of 85% or more, more preferably, a reflectance of 90% or more with respect to the irradiation light.

Further, examples of a material which can be used for the reflective layer 102 include aluminum, silver, gold, platinum, copper, an alloy containing aluminum (for example, an aluminum-titanium alloy, an aluminum-neodymium alloy, and an aluminum-titanium alloy), and an alloy containing silver (a silver-neodymium alloy).

Note that the reflective layer 102 can be formed by a variety of methods. For example, the reflective layer 102 can be formed by a sputtering method, an electron beam evaporation method, or a vacuum evaporation method. Preferably, the thickness of the reflective layer 102 is 100 nm or more although it depends on a material. With a thickness of 100 nm or more, transmission of the irradiation light through the reflective layer 102 can be suppressed.

Note that the kind of a suitable material for the reflective layer 102 varies depending on the wavelength of light with which the first substrate 101 is irradiated. The reflective layer is not limited to a single layer and may include a plurality of layers. Alternatively, the absorbing layer 103 may be directly formed on the first substrate 101 without providing the reflective layer therebetween.

Note that the larger the difference in reflectance between the reflective layer 102 and the absorbing layer 103 is, the more preferable it is. Specifically, the difference in reflectance to the wavelength of the irradiation light is preferably 25% or more, more preferably, 30% or more.

In addition, although any of various kinds of methods can be employed for forming the opening in the reflective layer 102, use of dry etching is preferable. By use of dry etching, the opening has a sharper sidewall and thus a fine pattern can be formed.

Next, the heat insulating layer 104 is selectively formed over the reflective layer 102. The heat insulating layer 104 suppresses heating and sublimation of the portion of the material layer 105, which overlaps with the reflective layer 102. For the heat insulating layer 104, for example, titanium oxide, silicon oxide, silicon oxynitride, zirconium oxide, titanium carbide, or the like can be preferably used. Note that for the heat insulating layer 104, a material having lower heat conductivity than materials used for the reflective layer 102 and the absorbing layer 103 is used. Note that in this specification, oxynitride is a substance which contains more oxygen than nitrogen.

The heat insulating layer 104 can be formed by any of a variety of methods. For example, the heat insulating layer 104 can be formed by a sputtering method, an electron beam evaporation method, a vacuum evaporation method, a chemical vapor deposition (CVD) method, or the like. The thickness of the heat insulating layer can be greater than or equal to 10 nm and less than or equal to 2 μm, preferably greater than or equal to 100 nm and less than or equal to 600 nm, although it depends on a material. By setting the thickness of the heat insulating layer 104 to be greater than or equal to 10 nm and less than or equal to 2 μm, an effect of blocking heat conduction to the portion of the material layer 105, which is located over the reflective layer 102, can be obtained even when the reflective layer 102 is heated.

In addition, the heat insulating layer 104 includes an opening in the region overlapping with the opening of the reflective layer 102. Although any of a variety of methods can be employed for forming a pattern of the heat insulating layer 104, the use of dry etching is preferable. By the use of dry etching, the patterned heat insulating layer 104 has a sharper sidewall and thus a fine pattern can be formed.

Note that preferably, the heat insulating layer 104 and the reflective layer 102 are patterned in one-time etching process, and accordingly the sidewalls of the openings provided in the heat insulating layer 104 and the reflective layer 102 can be aligned with each other, whereby a finer pattern can be formed.

In this embodiment, the heat insulating layer 104 is formed only at a position overlapping with the reflective layer 102; however, the heat insulating layer 104 may be formed so as to cover the reflective layer 102 and the opening of the reflective layer 102. In that case, the heat insulating layer 104 needs to have a transmitting property with respect to visible light.

Next, the absorbing layer 103 is formed over the heat insulating layer 104. The absorbing layer 103 can be formed using a material which is similar to that of the absorbing layer 12 described in Embodiment 1. Note that the absorbing layer 103 may be selectively formed. For example, the absorbing layer 103 may be formed over the entire surface of the first substrate 101 and then patterned in an island shape so as to cover the openings of the reflective layer 102 and the heat insulating layer 104. In this case, heat conduction in the plane direction of the absorbing layer can be prevented compared to the case where the absorbing layer is formed over the entire surface. Thus, the EL layer can be patterned more finely, and accordingly a high-performance light-emitting device can be achieved.

Next, the protective layer 106 is formed over the absorbing layer 103. The protective layer 106 is formed so as to prevent a substance used for the absorbing layer 103 from being sublimated and being mixed into an EL layer to be formed on the deposition target substrate as an impurity. Further, the protective layer 106 prevents oxidation, change in property, or deformation due to heat of the absorbing layer 103. The formation of the protective layer 106 can prevent deterioration of the absorbing layer 103; thus, the deposition substrate can be used repeatedly over a larger number of times. Thus, consumption and cost of the material can be suppressed. The protective layer 106 is formed, for example, using silicon nitride (SiNx), silicon nitride oxide, titanium oxide, silicon oxide, silicon oxynitride, zirconium oxide, titanium nitride, titanium carbide, indium oxide-tin oxide (ITO: indium tin oxide), or the like. The protective layer 106 is preferably formed to have a thickness with which the absorbing layer 103 can be favorably protected, for example, a thickness of about 100 nm. Note that the protective layer 106 is not necessarily provided. Further, the protective layer 106 may be selectively formed at a portion overlapping with the absorbing layer 103.

Next, the material layer 105 is formed over the protective layer 106. The material layer 105 can be formed using a material which is similar to that of the material layer 13 described in Embodiment 1. Further, the material layer 105 may be selectively formed.

Figure 2B:
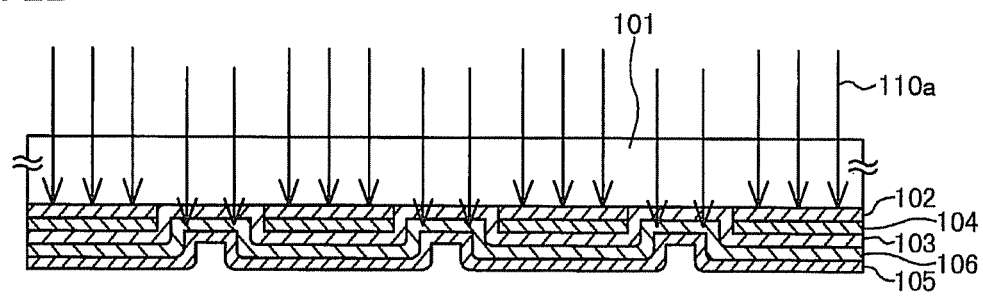

Next, as shown in FIG. 2B, light irradiation is performed using a flash lamp as indicated by arrows 110a from the reverse side of the first substrate 101, that is, a surface opposite to the surface where the material layer 105 is formed. The irradiation condition at this time is set such that the deposition material contained in the material layer 105 is not sublimated. That is, the energy intensity is set such that the material layer 105 is heated to a temperature lower than the sublimation temperature of the deposition material. Further, the energy intensity is preferably set such that the material layer 105 is heated to 100° C. or more. The irradiation light is transmitted through the first substrate 101, reflected in a region where the reflective layer 102 is formed, and transmitted through the opening 112 provided in the reflective layer 102 to be absorbed by the portion of the absorbing layer 103, which overlaps with the opening. The absorbed light is converted to thermal energy, whereby the portion of the material layer 105, which overlaps with the absorbing layer 103, is heated to a temperature lower than the sublimation temperature of the organic material 105 (first heat treatment). Thus, impurities such as moisture or residual solvents in the material layer 105 are removed. Note that the molecular weight of the impurity is 300 or less. When the heat temperature of the material layer 105 is 100° C. or more, the impurity of which molecular weight is 300 or less is sufficiently removed.

Figure 2C:
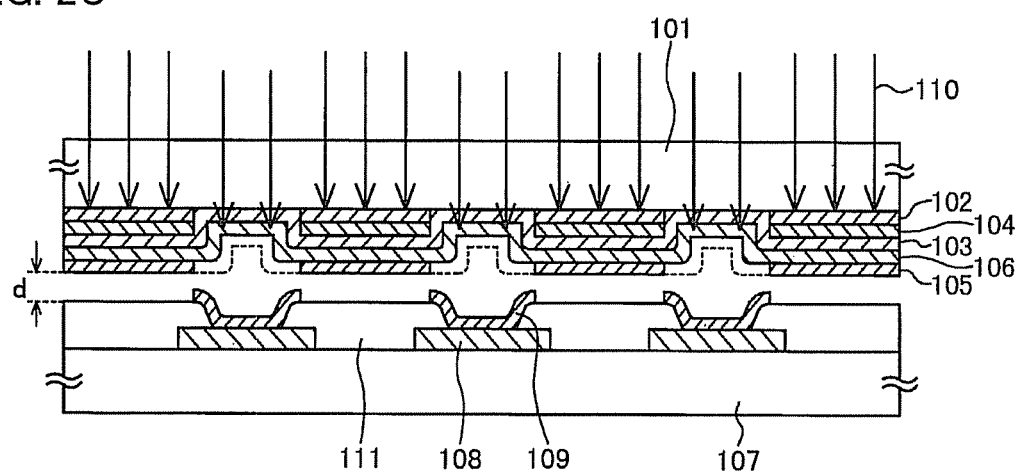

Next, as shown in FIG. 2C, the second substrate 107 is arranged at a position facing a surface of the first substrate 101, on which the material layer 105 and the like are formed. Note that here, the case is described where an EL layer of a light-emitting element is formed using the deposition substrate of one embodiment of the present invention, and thus an electrode layer 108 serving as one electrode of the light emitting element is formed on the second substrate 107. End portions of the electrode layer 108 are preferably covered with an insulator 111. In this embodiment, the electrode layer 108 shows an electrode to be an anode or a cathode of the light emitting element.

Note that the first heat treatment shown in FIG. 2B may be performed in a state where the first substrate 101 and the second substrate 107 are arranged to face each other as shown in FIG. 2C. However, it is more preferable that the first heat treatment be performed before the second substrate is arranged to face the first substrate so as to prevent impurities released from the first substrate that is subjected to the heat treatment from attaching to the second substrate.

A surface of the material layer 105 and a surface of the second substrate 107 are placed to have a distance d therebetween. Specifically, the distance d is 0 mm or more and 2 mm or less, preferably, 0 mm or more and 0.05 mm or less, or more preferably, 0 mm or more and 0.03 mm or less.

It is to be noted that the distance d is defined as a distance between a surface of the material layer 105 over the first substrate and the surface of the second substrate. However, in the case where a certain kind of film (for example, a conductive film serving as an electrode, a partition wall, or the like) is formed on the second substrate and thus the surface of the deposition target substrate has unevenness, the distance d is defined as a distance between the surface of the material layer 105 over the first substrate and a topmost surface of a layer formed on the second substrate, that is, a surface of the film (the conductive film, the partition wall, or the like).

After that, as shown in FIG. 2C, light irradiation is performed using flash lamp as indicated by arrows 110 from the reverse side of the first substrate 101. The irradiation condition at this time is such that the deposition material included in the material layer 105 is sublimated. That is, the energy intensity is set such that the material layer 105 is heated to a temperature which is greater than or equal to the sublimation temperature of the deposition material. The irradiation light is transmitted through the first substrate 101, reflected in a region where the reflective layer 102 is formed, and transmitted through the opening 112 provided in the reflective layer 102 to be absorbed by the portion of the absorbing layer 103, which overlaps with the opening. The absorbed light is converted to thermal energy, whereby the portion of the material layer 105, which overlaps with the absorbing layer 103, is heated (second heat treatment) and the deposition material contained in the material layer 105 is deposited on the second substrate 107. Accordingly, an EL layer 109 of a light-emitting element is formed on the second substrate 107.

Note that when the first substrate 101 is irradiated with light 110, heat generated in the absorbing layer 103 is conducted in the plane direction to heat the reflective layer 102 in contact with the absorbing layer. In addition, even if the reflective layer 102 is formed using a material having a reflectance of 85% or more, a certain amount of heat is absorbed depending on the energy power of the irradiation light. However, in the deposition substrate of this embodiment, since the heat insulating layer 104 formed using a material having low heat conductivity are provided between the reflective layer 102 and the material layer 105, even when the reflective layer 102 is heated, conduction of heat to the material layer 105 can be blocked by the heat insulating layer 104. Accordingly, the deposition material contained in the material layer 105 in a portion overlapping with the opening 112 can be formed over the deposition target substrate, and the EL layer 109 that is desirably patterned can be formed.

According to this embodiment, before deposition is performed by transferring the material layer 105 formed over the deposition substrate to the deposition target substrate, the first heat treatment is performed in which the material layer 105 of the deposition substrate is heated to a temperature lower than the sublimation temperature of the deposition material (that is, a temperature at which the material layer is not transferred) as pretreatment. Accordingly, impurities such as moisture or residual solvents which have lower sublimation temperatures can be removed from the material layer 105 while the deposition material is held in the material layer 105, whereby the deposition substrate including the material layer 105 containing few impurities can be obtained (see FIG. 2B). Thus, impurities in the EL layer 109 that is a layer containing the deposition material formed by being transferred to the deposition target substrate can be reduced; therefore, an organic EL element with favorable characteristics and high reliability can be manufactured.

Note that although the case where the second substrate 107 that is the deposition target substrate is located below the first substrate 101 that is the supporting substrate is illustrated in this embodiment, this embodiment is not limited to this structure. The orientation of the substrates can be set as appropriate.

(Embodiment 3)

In this embodiment, a deposition method of one embodiment of the present invention is described. In this embodiment, a case where an EL layer of a light-emitting element is formed by the deposition method of one embodiment of the present invention is described. Further, in this embodiment, a case where heat treatment is performed using a light source is described. FIGS. 3A to 3D are cross-sectional views illustrating a deposition method of one embodiment of the present invention. The same portions as those in FIG. 1 are denoted by the same reference numerals.

Figure 3A:
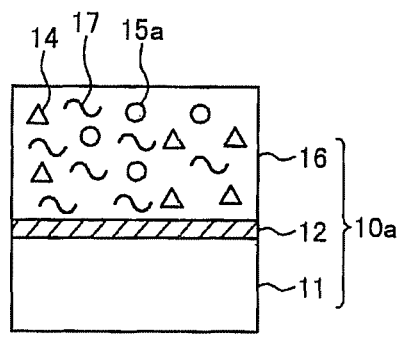
FIGS. 3A to 3D are cross-sectional views illustrating a deposition method according to one embodiment of the present invention.
Figure 3C:
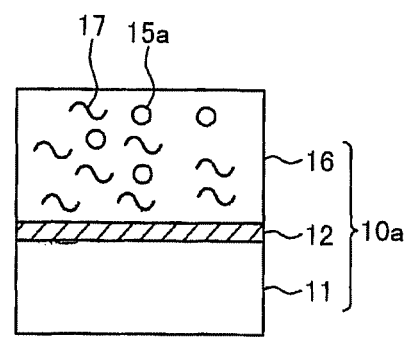
Figure 3B:
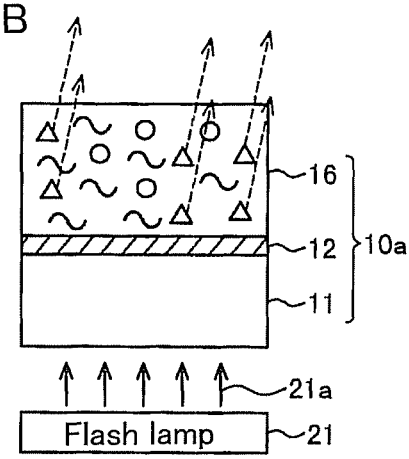
Figure 3D:
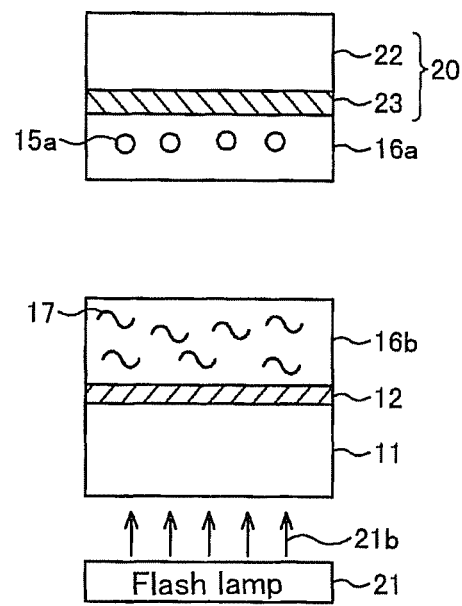

First, a method for manufacturing a deposition substrate (donor substrate) 10a shown in FIGS. 3A to 3C is described.

As shown in FIG. 3A, an absorbing layer 12 is formed on one surface of a first substrate 11. An organic EL material layer (hereinafter referred to as a material layer) 16 including at least an organic material 15a as a first deposition material, an organic material (not shown) as a second deposition material, and a high molecular compound (polymer) 17 is formed over the absorbing layer 12. In FIG. 3A, the material layer 16 includes impurities 14 such as moisture, residual solvents, or residual monomers.

As the first substrate 11, a substrate similar to that in Embodiment 1 can be used.

The absorbing layer 12 absorbs irradiation light used for heating the material layer 16 and converts the irradiation light into heat. A layer similar to that in Embodiment 1 can be used as the absorbing layer 12. Note that the absorbing layer 12 may transmit part of the irradiation light as long as the organic material 15a contained in the material layer 16 is heated to a deposition temperature. However, when the absorbing layer 12 transmits part of the irradiation light, a material that does not decompose even when irradiated with light is preferably used for the material layer 13.

The material layer 16 is transferred to a second substrate by being heated. The material layer 16 is a layer containing the organic material 15a as the first deposition material and the organic material as the second deposition material, to be deposited on the deposition target substrate. In this embodiment, two kinds of deposition materials, the first deposition material and the second deposition material, are used for the material layer 16; however, three or more kinds of deposition materials may be used for the material layer 16. The material layer 16 may be a single layer or a stacked layer including a plurality of layers. In this embodiment, "transfer" means that the first deposition material and the second deposition material contained in the material layer 16 are transferred to the deposition target substrate.

The material layer 16 can be formed by a wet method. In order to form the material layer 16 by a wet method, a desired first deposition material, second deposition material and high molecular compound may be dissolved or dispersed in a solvent, and a solution or a dispersion solution may be adjusted. There is no particular limitation on the solvent as long as it can dissolve or disperse the first deposition material, the second deposition material, and the high molecular compound and it does not react with the first deposition material, the second deposition material, and the high molecular compound. Examples of the solvent include a halogen-based solvent such as chloroform, tetrachloromethane, dichloromethane, 1,2-dichloroethane, or chlorobenzene; a ketone-based solvent such as acetone, methyl ethyl ketone, diethyl ketone, n-propyl methyl ketone, or cyclohexanone; an aromatic solvent such as benzene, toluene, or xylene; an ester-based solvent such as ethyl acetate, n-propyl acetate, n-butyl acetate, ethyl propionate, γ-butyrolactone, or diethyl carbonate; an ether-based solvent such as tetrahydrofuran or dioxane; an amide-based solvent such as dimethylformamide or dimethylacetamide; dimethyl sulfoxide; hexane; water; and the like. Further, a mixture of plural kinds of those solvents may be used. By using a wet method, it is possible to increase use efficiency of the material and reduce the manufacturing cost.

Note that the thickness of an EL layer 16a formed, in a later step (a step of FIG. 3D), on the second substrate 22 that is the deposition target substrate depends on the material layer 16 formed over the first substrate 11 that is the supporting substrate. Therefore, by controlling the thicknesses of the material layer 16, the thickness of the EL layer 16a formed on the second substrate 22 that is the deposition target substrate can be easily controlled. Note that the material layer does not necessarily need to be a uniform layer as long as the thickness and uniformity of the EL layer are ensured. For example, the material layer may be formed in a minute island shape or may have unevenness.

In this embodiment, to form the EL layer of the light-emitting element on the deposition target substrate, a light-emitting substance and an organic compound in which a light-emitting substance is dispersed are used for the organic material 15a as the first deposition material and the second deposition material which are contained in the material layer 16, respectively.

As the light-emitting substance, for example, a fluorescent compound which emits fluorescence or a phosphorescent compound which emits phosphorescence can be used.

As the organic compound in which the light-emitting substance is dispersed, in the case where the light-emitting substance is a fluorescent compound, a substance having higher singlet excitation energy (the energy difference between a ground state and a singlet excited state) than the fluorescent compound is preferably used. In the case where the light-emitting substance is a phosphorescent compound, a substance having higher triplet excitation energy (the energy difference between a ground state and a triplet excited state) than the phosphorescent compound is preferably used.

Note that two or more kinds of organic compounds in which light-emitting substances are to be dispersed may be used or two or more kinds of light-emitting substances that are to be dispersed in the organic compound may be used for the deposition material contained in the material layer 16. Alternatively, two or more kinds of organic compounds in which light-emitting substances are to be dispersed and two or more kinds of light-emitting substances may be used.

As the high molecular compound 17 contained in the material layer 16, a high molecular compound having a glass transition temperature satisfying the following formula (1) is used. Preferably, a high molecular compound having a glass transition temperature satisfying the following formula (2) is used. Note that in the following formulas (1) and (2), the sublimation temperatures of the first deposition material and the second deposition material are measured at the same vacuum level (for example, the degree of vacuum is $10^{-3}$ Pa).

$$Ta-100 \leq S \leq 400 \quad (1)$$

$$Ta-70 \leq S \leq 400 \quad (2)$$

In the formulas (1) and (2), S indicates the glass transition temperature (° C.) of the high molecular compound, and Ta indicates the higher (° C.) of the sublimation temperature of first deposition material and that of the second deposition material.

As long as the glass transition temperature of the high molecular compound 17 is in the range satisfying the formula (1), preferably the formula (2), even if the temperature of the material layer 16 reaches the lower of the sublimation temperature of the first deposition material and that of the second deposition material, the deposition material which reaches the sublimation temperature is hardly transferred from the material layer 16. This is because the movement of the first deposition material and the second deposition material in the material layer 16 is suppressed by the high molecular compound 17. When the temperature of the material layer 16 exceeds the higher of the sublimation temperature of the first deposition material and that of the second deposition material, the first deposition material and the second deposition material easily move in the material layer 16 and are transferred to the deposition target substrate. Thus, time lag is not easily generated between the transfer of the first deposition material and the transfer of the second deposition material and an EL layer with a small concentration gradient can be formed on the deposition target substrate.

However, if the glass transition temperature of the high molecular compound 17 is lower than the range of the formula (1), it is difficult to suppress the movement of the first deposition material and the second deposition material in the material layer 16. Thus, the deposition material having a lower sublimation temperature is transferred first and then the deposition material having a higher sublimation temperature is transferred. Alternatively, if the glass transition temperature of the high molecular compound 17 is higher than the range of the formula (1), the movement of the first deposition material and the second deposition material in the material layer 16 is suppressed even after the temperature of the material layer 16 exceeds the higher of the sublimation temperature of first deposition material and that of the second deposition material; therefore, the transfer is not easily performed.

Thus, as the high molecular compound 17, a high molecular compound having a glass transition temperature satisfying the formula (1), preferably the formula (2) is used.

Note that a favorable transfer is achieved when a material having a glass transition temperature of 200° C. is used as the high molecular compound 17 and a material having a sublimation temperature of 210° C. and a material having a sublimation temperature of 260° C. are used as the first deposition material and the second deposition material, respectively. On the other hand, a favorable transfer is not achieved when a material having a glass transition temperature of 200° C. is used as the high molecular compound 17 and a material having a sublimation temperature of 210° C. and a material having a sublimation temperature of 302° C. are used as the first deposition material and the second deposition material, respectively. This indicates that a preferable material layer 16 is obtained under conditions satisfying the formulas (1) and (2).

As the high molecular compound 17 contained in the material layer 16, a cyclo-olefin polymer is preferable. The cyclo-olefin polymer is easily dissolved in a solvent; thus, after deposition is performed on the deposition target substrate, a cyclo-olefin polymer containing the first deposition material and the second deposition material which remain on the deposition substrate is redissolved in the solvent. In such a manner, the deposition substrate can be reused. Thus, consumption and cost of the material can be suppressed. Further, as the high molecular compound 17, olefin, vinyl, acrylic, polyimide (PI), or the like, or a high molecular EL material may be used. As the high molecular EL material, for example, poly(N-vinylcarbazole) (PVK) and poly(p-phenylenevinylene) (PPV) can be given. Further, a crosslinked polymer such as an epoxy resin, an acrylic resin, or siloxane may be used. Note that in this specification, a high molecular compound means a polymer having a repetition structure using one or more kinds of monomers.

The viscosity of a high molecular compound is easily adjusted, and thus, the viscosity of a solution of the high molecular compound can be freely adjusted depending on a use. For example, in the case where the material layer 16 is formed by a droplet discharge method, the viscosity of a solution of the high molecular compound is increased, whereby the high molecular compound does not spread over a deposition target surface, so that a fine pattern can be formed.

The viscosity of the high molecular compound can be adjusted by adjusting molecular weight of a high molecular compound or changing a ratio of a high molecular material to a solvent. In general, the viscosity of a solution is increased as a ratio of a high molecular compound is increased.

Next, as shown in FIG. 3B, light irradiation is performed using a flash lamp 21 as indicated by arrows 21a from the reverse side of the first substrate 11, that is, a surface opposite to the surface where the material layer 16 is formed. The irradiation condition at this time is set such that the high molecular compound 17 is not softened. That is, the energy intensity is set such that the material layer 16 is heated to a temperature lower than the glass transition temperature of the high molecular compound 17. Further, the energy intensity is preferably set such that the material layer 16 is heated to 100° C. or more. The irradiated light is transmitted through the first substrate 11 and absorbed in the absorbing layer 12. The absorbed light is converted to thermal energy, whereby a portion of the material layer 16, which overlaps with the absorbing layer 12, is heated (first heat treatment) to a temperature lower than the glass transition temperature of the high molecular compound 17. Accordingly, the impurities 14 in the material layer 16 such as moisture, residual solvents, or residual monomers are removed. Note that the molecular weight of the impurity 14 is 300 or less. When the heat temperature of the material layer 16 is 100° C. or more, the impurity 14 of which molecular weight is 300 or less is sufficiently removed.

As described above, the deposition substrate (donor substrate) 10a shown in FIG. 3C is manufactured. Next, a deposition method in which the material layer 16 is transferred to the deposition target substrate 20 using the deposition substrate 10a as shown in FIG. 3 D is described.

The second substrate 22 that is a deposition target substrate is arranged at a position facing a surface of the first substrate 11, on which the absorbing layer 12 and the material layer 16 are formed. As the second substrate 22, a substrate similar to that in Embodiment 1 can be used.

After that, second heat treatment is performed from the reverse side of the first substrate 11, that is, the other surface of the first substrate 11 over which the material layer 16 is formed, so that the first deposition material and the second deposition material in the material layer 16 are deposited on the second substrate 22. Accordingly, the EL layer 16a of the light-emitting element is formed on the second substrate 22, and a layer 16b having the high molecular compound 17 remains on the first substrate 11. The second heat treatment is performed by light irradiation using the flash lamp 21 as indicated by arrows 21b. More specifically, the irradiation light is transmitted through the first substrate 11 and absorbed in the absorbing layer 12. The absorbed light is converted to thermal energy, whereby the portion of the material layer 16, which overlaps with the absorbing layer 12, is heated. The heated material layer 16 is deposited on the electrode layer 23, whereby the EL layer 16a is formed.

The EL layer 16a is formed to be thinner than the material layer 16. Further, decomposed matters of the high molecular compound 17 may be mixed into the EL layer 16a. Thus, the high molecular compound contained in the EL layer 16a is preferably a material whose decomposed matters do not affect characteristics of the EL layer.

In this embodiment, it is preferable that the temperature of the second heat treatment be set within a range that exceeds the sublimation temperatures of the first deposition material and the second deposition material and that does not exceed 50° C. from the sublimation temperatures of the first deposition material and the second deposition material. Here, the temperature of the heat treatment is measured at the surface of the first substrate.

Further, it is preferable that the second heat treatment be performed at a temperature greater than or equal to the highest sublimation temperature in the sublimation temperatures of the first deposition material and the second deposition material. In this case, the temperature of the second heat treatment is preferably set high within a range exceeding the sublimation temperature of the deposition material with the highest sublimation temperature and 50° C. or less. However, the temperature of the second heat treatment may be set low (greater than or equal to the sublimation temperature of the substance with the highest sublimation temperature) in consideration of the decomposition temperature of a substance with a lower sublimation temperature, a distance from the deposition target substrate, and a material and the thickness of the deposition target substrate.

In this embodiment, the flash lamp 21 is used as a light source of the irradiation light in the first and the second heat treatment; however, a variety of light sources can be used as in Embodiment 1.

It is preferable that the first and the second heat treatment be performed in an atmosphere containing little hydrogen and oxygen, or a reduced-pressure atmosphere. The reduced-pressure atmosphere can be obtained by evacuation of the deposition chamber with a vacuum evacuation unit to a vacuum of about $5 \times 10^{-3}$ Pa or less, preferably, about $10^{-4}$ Pa to $10^{-6}$ Pa.

According to this embodiment, before the deposition is performed by transferring the material layer 16 formed over the deposition substrate 10a to the deposition target substrate 20, the first heat treatment is performed in which the material layer 16 of the deposition substrate 10a is heated to a temperature lower than the glass transition temperature of the high molecular compound 17 (that is, a temperature at which the material layer 16 is not transferred) as pretreatment. Accordingly, the impurities 14 such as moisture or residual solvents which have lower sublimation temperatures can be removed from the material layer 16 while the first deposition material and the second deposition material are held in the material layer 16, whereby the deposition substrate 10a having the material layer 16 containing few impurities can be obtained (see FIG. 3C). Thus, the impurities in the EL layer 16a that is a layer containing the first deposition material and the second deposition material formed by being transferred to the deposition target substrate 20 can be reduced; therefore, an organic EL element with favorable characteristics and high reliability can be manufactured.

Note that although the case where the second substrate 22 that is the deposition target substrate is located above the first substrate 11 that is the deposition substrate is illustrated in this embodiment, this embodiment is not limited to this structure. The orientation of the substrates can be set as appropriate.

(Embodiment 4)

In this embodiment, a deposition method of one embodiment of the present invention is described. Note that a case where an EL layer of a light-emitting element is formed using the deposition method of one embodiment of the present invention is described in this embodiment. Note that in the deposition method described in this embodiment, a material and a manufacturing method that are similar to those of Embodiment 3 are used if not otherwise stated.

Figure 4A:
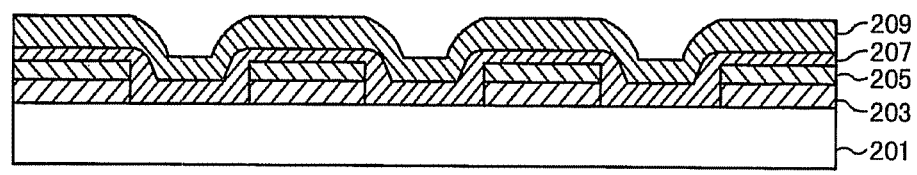
FIGS. 4A to 4C are cross-sectional views illustrating a deposition method according to one embodiment of the present invention.

FIG. 4 shows an example of the case of forming a reflective layer and a heat insulating layer over a first substrate. In FIG. 4A, a reflective layer 203 is selectively fainted over one surface of a first substrate 201 that is a supporting substrate. The reflective layer 203 includes an opening. Further, a heat insulating layer 205 is formed over the reflective layer 203. Note that the heat insulating layer 205 includes an opening in a position overlapping with the opening of the reflective layer 203. Further, an absorbing layer 207 covering the openings is formed over the first substrate 201 over which the reflective layer 203 and the heat insulating layer 205 are formed. Further, an organic EL material layer 209 (hereinafter referred to as a material layer) containing at least a first deposition material, a second deposition material, and a high molecular compound (polymer) is formed over the absorbing layer 207. In FIG. 4A, the material layer 209 includes impurities such as moisture, residual solvents, or residual monomers.

A method for manufacturing a deposition substrate and a deposition method using the deposition substrate are described below.

First, the reflective layer 203 is selectively formed on the one surface of the first substrate 201. The reflective layer 203 reflects light with which the first substrate 201 is irradiated to block a portion of the material layer 209, which overlaps with the reflective layer 203, so that heat is not transmitted to this portion. Note that a layer similar to that in Embodiment 2 can be used as the reflective layer 203.

Next, the heat insulating layer 205 is selectively formed over the reflective layer 203. The heat insulating layer 205 suppresses heating and sublimation of the portion of the material layer 209, which overlaps with the reflective layer 203. As the heat insulating layer 205, a layer similar to that in Embodiment 2 can be used.

Next, the absorbing layer 207 is formed over the heat insulating layer 205. As the absorbing layer 207, a layer similar to that in Embodiment 2 can be used.

Next, the material layer 209 is formed over the absorbing layer 207. As the material layer 209, a layer similar to that in Embodiment 3 can be used.

Figure 4B:
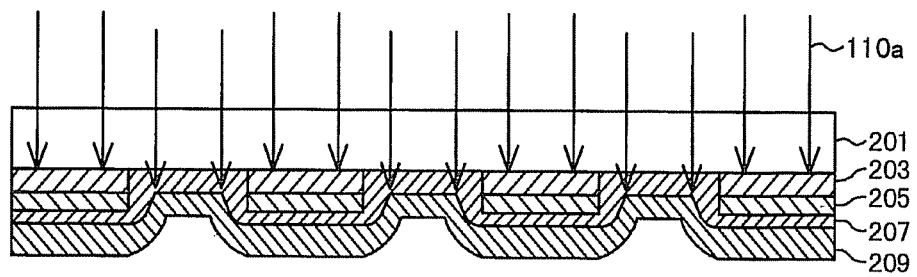

After that, as shown in FIG. 4B, light irradiation is performed using a flash lamp as indicated by arrows 110a from the reverse side of the first substrate 201, that is a surface opposite to the surface where the material layer 209 is formed. The irradiation condition at this time is such that the high molecular compound contained in the material layer 209 is not softened. That is, the energy intensity is set such that the material layer 209 is heated to a temperature lower than the glass transition temperature of the high molecular compound. Preferably, the energy intensity is set such that the material layer 209 is heated to 100° C. or more. The irradiation light is transmitted through the first substrate 201, reflected in a region where the reflective layer 203 is formed, and transmitted through the opening provided in the reflective layer 203 to be absorbed by the portion of the absorbing layer 207, which overlaps with the opening. The absorbed light is converted to thermal energy, whereby a portion of the material layer 209, which overlaps with the absorbing layer 207, is heated to a temperature lower than the glass transition temperature of the high molecular compound (first heat treatment). Thus, impurities such as moisture, residual solvents, or residual monomers in the material layer 209 are removed. Note that the molecular weight of the impurity is 300 or less. When the heat temperature of the material layer 209 is 100° C. or more, the impurity of which molecular weight is 300 or less is sufficiently removed.

Figure 4C:
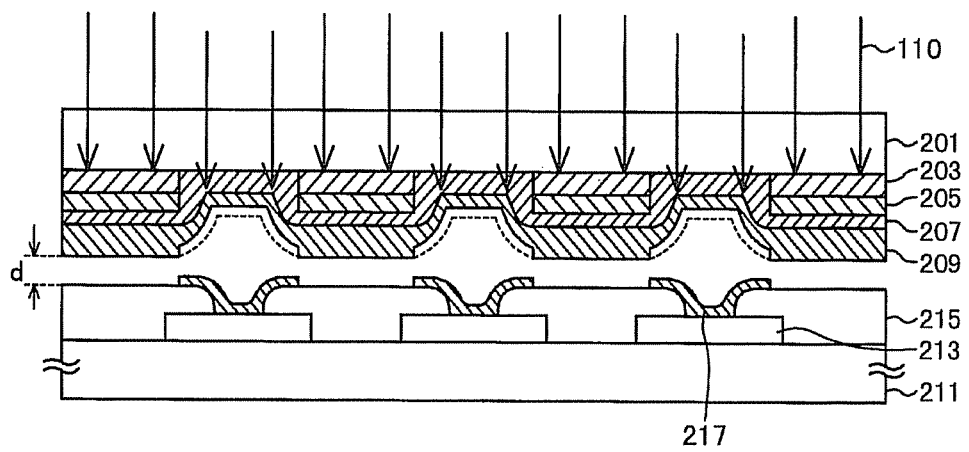

Next, as shown in FIG. 4C, the second substrate 211 is arranged at a position facing a surface of the first substrate 201, on which the material layer 209 and the like are formed. In addition, the case is described where an EL layer of a light-emitting element is formed using the deposition substrate of one embodiment of the present invention, and thus an electrode layer 213 serving as one electrode of the light emitting element is formed on the second substrate 211. End portions of the electrode layer 213 are preferably covered with an insulator 215. In this embodiment, the electrode layer shows an electrode to be an anode or a cathode of the light emitting element.

Note that the first heat treatment shown in FIG. 4B may be performed in a state where the first substrate 201 and the second substrate 211 are arranged to face each other as shown in FIG. 4C. It is preferable that the first heat treatment be performed before the second substrate is arranged to face the first substrate so as to prevent impurities released from the first substrate that is subjected to the first heat treatment from attaching to the second substrate.

A surface of the first material layer 209 and a surface of the second substrate 211 are arranged to have a distance d therebetween. This is similar to that described in Embodiment 2.

After that, as shown in FIG. 4C, light irradiation is performed using a flash lamp as indicated by arrows 110 from the reverse side of the first substrate 201. The irradiation condition at this time is such that the first deposition material and the second deposition material contained in the material layer 209 are sublimated. That is, the energy intensity is set such that the material layer 209 is heated to a temperature which is greater than or equal to the highest sublimation temperature in the sublimation temperatures of the first deposition material and the second deposition material. The irradiation light is transmitted through the first substrate 201, reflected in a region where the reflective layer 203 is formed, and transmitted through the opening provided in the reflective layer 203 to be absorbed by the portion of the absorbing layer 207, which overlaps with the opening. The absorbed light is converted to thermal energy, whereby the portion of the material layer 209, which overlaps with the absorbing layer 207, is heated (second heat treatment) and the first deposition material and the second deposition material included in the material layer 209 is formed on the second substrate 211. Accordingly, an EL layer 217 of the light-emitting element is selectively formed on the second substrate 211.

According to this embodiment, before the deposition is performed by transferring the material layer 209 formed over the deposition substrate to the deposition target substrate, the first heat treatment is performed in which the material layer 209 of the deposition substrate is heated to a temperature lower than the glass transition temperature of the high molecular compound (that is, a temperature at which the material layer 209 is not transferred) as pretreatment. Accordingly, the impurities such as moisture, residual solvents, or residual monomers, which have lower sublimation temperatures can be removed from the material layer 209 while the first deposition material and the second deposition material are held in the material layer 209, whereby the deposition substrate including the material layer 209 containing few impurities can be obtained (see FIG. 4B). Thus, the impurities in the EL layer 217 that is a layer containing the first deposition material and the second deposition material formed by being transferred to the deposition target substrate can be reduced; therefore, an organic EL element with favorable characteristics and high reliability can be manufactured.

REFERENCE NUMERALS

10, 10*a*: deposition substrate (donor substrate)
11: first substrate
12: absorbing layer
13, 16: material layer
13*a*, 16*a*: EL layer
14: impurity
15,15*a*: organic material
16*b*: layer having high molecular compound
17: high molecular compound (polymer)
21: flash lamp
21*a*,21*b*: arrow
23, 108, 213: electrode layer
101, 201: first substrate
102, 203: reflective layer
103, 203: absorbing layer
104, 205: heat insulating layer
105, 209: material layer
106: protective layer
107, 211: second substrate
109, 217: EL layer
110, 110*a*: arrow
111, 215: insulator.

The invention claimed is:

1. A deposition method comprising the steps of:
   forming an absorbing layer over one surface of a first substrate;
   forming a material layer containing a first deposition material, a second deposition material, and a polymer on the absorbing layer;
   performing first heat treatment on the material layer from an other surface of the first substrate to a temperature lower than a glass transition temperature of the polymer so as to remove an impurity in the material layer;
   disposing the one surface of the first substrate and a deposition target surface of a second substrate to face each other; and
   performing second heat treatment on the material layer from the other surface of the first substrate so as to form a layer containing the first deposition material and the second deposition material on the deposition target surface of the second substrate,
   wherein the polymer, the first deposition material, and the second deposition material satisfy the following range below, $Ta-100 \leq S \leq 400$ wherein S indicates a glass transition temperature (° C.) of the polymer, and Ta indicates the higher of a sublimation temperature of the first deposition material and a sublimation temperature of the second deposition material,
   wherein the first heat treatment is performed by irradiating the absorbing layer with light from the other surface of the first substrate, and
   wherein the polymer is cyclo-olefin polymer.

2. The deposition method according to claim 1, wherein the second heat treatment is performed by irradiating the absorbing layer with light from the other surface of the first substrate.

3. A method for manufacturing a deposition substrate comprising the steps of:
   forming an absorbing layer over one surface of a substrate;
   forming a material layer containing a first deposition material, a second deposition material, and a polymer on the absorbing layer; and
   performing heat treatment on the material layer from an other surface of the substrate to a temperature lower than a glass transition temperature of the polymer so as to remove an impurity in the material layer,
   wherein the polymer, the first deposition material, and the second deposition material satisfy the following range below, $Ta-100 \leq S \leq 400$ wherein S indicates a glass transition temperature (° C.) of the polymer, and Ta indicates the higher of a sublimation temperature of the first deposition material and a sublimation temperature of the second deposition material,
   wherein the heat treatment is performed by irradiating the absorbing layer with light from the other surface of the substrate, and
   wherein the polymer is cyclo-olefin polymer.

4. A method for manufacturing a deposition substrate comprising the steps of:
   forming an absorbing layer over one surface of a first substrate;
   forming a material layer containing a first deposition material, a second deposition material, and a polymer on the absorbing layer;
   performing first heat treatment on the material layer from an other surface of the first substrate to a temperature lower than a glass transition temperature of the-polymer so as to remove an impurity in the material layer;
   disposing the one surface of the first substrate and a deposition target surface of a second substrate to face each other;
   performing second heat treatment on the material layer from the other surface of the first substrate so as to form a layer containing the first deposition material and the second deposition material on the deposition target surface of the second substrate,
   dissolving the material layer over the one surface of the first substrate; and
   reusing the first substrate,
   wherein the polymer, the first deposition material, and the second deposition material satisfy the following range below, $Ta-100 \leq S \leq 400$ wherein S indicates a glass transition temperature (° C.) of the polymer, and Ta indicates the higher of a sublimation temperature of the first deposition material and a sublimation temperature of the second deposition material,
   wherein the first heat treatment is performed by irradiating the absorbing layer with light from the other surface of the first substrate, and
   wherein the polymer is cyclo-olefin polymer.

5. The method for manufacturing a deposition substrate according to claim 4, wherein the second heat treatment is performed by irradiating the absorbing layer with light from the other surface of the first substrate.

6. The deposition method according to claim 1,
wherein a reflective layer is formed between the absorbing layer and the one surface of the first substrate, and
wherein a heat-insulating layer is formed between the absorbing layer and the reflective layer.

7. The deposition method according to claim 1, wherein the first heat treatment is performed under degree of vacuum of $10^{-4}$ Pa to $10^{-6}$ Pa.

8. The deposition method according to claim 1, wherein the absorbing layer is capable of transmitting part of the light.

9. The method for manufacturing a deposition substrate according to claim 3,
wherein a reflective layer is formed between the absorbing layer and the one surface of the substrate, and
wherein a heat-insulating layer is formed between the absorbing layer and the reflective layer.

10. The method for manufacturing a deposition substrate according to claim 3, wherein the heat treatment is performed under degree of vacuum of $10^{-4}$ Pa to $10^{-6}$ Pa.

11. The method for manufacturing a deposition substrate according to claim 3, wherein the absorbing layer is capable of transmitting part of the light.

12. The method for manufacturing a deposition substrate according to claim 4,
wherein a reflective layer is formed between the absorbing layer and the one surface of the first substrate, and
wherein a heat-insulating layer is formed between the absorbing layer and the reflective layer.

13. The method for manufacturing a deposition substrate according to claim 4, wherein the first heat treatment is performed under degree of vacuum of $10^{-4}$ Pa to $10^{-6}$ Pa.

14. The method for manufacturing a deposition substrate according to claim 4, wherein the absorbing layer is capable of transmitting part of the light.

15. The deposition method according to claim 1, wherein the first heat treatment is stopped before starting the second heat treatment.

16. The method for manufacturing a deposition substrate according to claim 4, wherein the first heat treatment is stopped before starting the second heat treatment.

* * * * *